(12) United States Patent
Li et al.

(10) Patent No.: US 9,034,752 B2
(45) Date of Patent: May 19, 2015

(54) METHODS OF EXPOSING CONDUCTIVE VIAS OF SEMICONDUCTOR DEVICES AND ASSOCIATED STRUCTURES

(71) Applicants: Hongqi Li, Boise, ID (US); Anurag Jindal, Boise, ID (US); Irina Vasilyeva, Boise, ID (US)

(72) Inventors: Hongqi Li, Boise, ID (US); Anurag Jindal, Boise, ID (US); Irina Vasilyeva, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 13/733,508

(22) Filed: Jan. 3, 2013

(65) Prior Publication Data

US 2014/0183740 A1   Jul. 3, 2014

(51) Int. Cl.
*H01L 21/4763*      (2006.01)
*H01L 21/768*       (2006.01)
*H01L 23/538*       (2006.01)

(52) U.S. Cl.
CPC ...... *H01L 21/76841* (2013.01); *H01L 23/5384* (2013.01); *H01L 2924/0002* (2013.01); *Y10S 438/927* (2013.01)

(58) Field of Classification Search
CPC .............. H01L 21/76877; H01L 21/76846; H01L 21/76843
USPC ......... 438/627, 643, 653, 629, 637, 639, 640, 438/667, 668, 672, 675, 700, 701, 713, 927, 438/978; 257/E21.577, E23.174, E23.145, 257/E23.067, E23.011, 751, 758, 754, 757, 257/762, 763, 774–776
See application file for complete search history.

(56) References Cited

U.S. PATENT DOCUMENTS

| | | | | |
|---|---|---|---|---|
| 5,573,633 A * | 11/1996 | Gambino et al. | ............. | 438/533 |
| 6,020,266 A * | 2/2000 | Hussein et al. | ............... | 438/694 |
| 6,136,649 A * | 10/2000 | Hui et al. | ....................... | 438/257 |
| 6,248,660 B1 * | 6/2001 | Hamanaka et al. | ........... | 438/629 |
| 6,339,029 B1 * | 1/2002 | Yu et al. | ......................... | 438/712 |
| 6,391,768 B1 * | 5/2002 | Lee et al. | ....................... | 438/633 |
| 6,479,384 B2 * | 11/2002 | Komai et al. | ................. | 438/687 |
| 6,803,304 B2 * | 10/2004 | Asami | ........................... | 438/613 |
| 6,828,226 B1 * | 12/2004 | Chen et al. | .................... | 438/626 |
| 6,878,621 B2 * | 4/2005 | Wu et al. | ........................ | 438/638 |
| 6,939,791 B2 * | 9/2005 | Geffken et al. | ............... | 438/622 |
| 7,214,594 B2 * | 5/2007 | Wong et al. | ................... | 438/319 |

(Continued)

OTHER PUBLICATIONS

Pares et al., Mid-Process Through Silicon Vias Technology Using Tungsten Metallization: Process Optimazation and Electrical Results, 2009 11th Electronics Packaging Technology Conference (2209) pp. 772-777.

(Continued)

*Primary Examiner* — Chris Chu
(74) *Attorney, Agent, or Firm* — TraskBritt

(57) ABSTRACT

Methods of exposing conductive vias of semiconductor devices may comprise conformally forming a barrier material over conductive vias extending from a backside surface of a substrate. A self-planarizing isolation material may be formed over the barrier material. An exposed surface of the self-planarizing isolation material may be substantially planar. A portion of the self-planarizing isolation material, a portion of the barrier material, and a portion of protruding material of the conductive vias may be removed to expose the conductive vias. Removal of the self-planarizing isolation material, the barrier material, and the conductive vias may be stopped after exposing at least one laterally extending portion of the barrier material.

26 Claims, 11 Drawing Sheets

(56) References Cited

U.S. PATENT DOCUMENTS

| | | | |
|---|---|---|---|
| 7,235,844 B2 * | 6/2007 | Itou | 257/341 |
| 7,833,806 B2 * | 11/2010 | Smith et al. | 438/3 |
| 8,093,120 B2 * | 1/2012 | Yeh et al. | 438/199 |
| 8,263,497 B2 | 9/2012 | Andry et al. | |
| 8,299,612 B2 | 10/2012 | West et al. | |
| 2012/0083116 A1 | 4/2012 | Yang et al. | |
| 2013/0140700 A1 * | 6/2013 | Ohmi | 257/751 |

OTHER PUBLICATIONS

Rowbotham et al., Back Side Exposure of Variable Size Through Silicon Vias, J. Vac. Sci. Technol., vol. B 24, No. 5, Sep./Oct. 2006, pp. 2460-2466.

* cited by examiner

METHODS OF EXPOSING CONDUCTIVE VIAS OF SEMICONDUCTOR DEVICES AND ASSOCIATED STRUCTURES

FIELD

The disclosure relates generally to semiconductor devices and semiconductor device fabrication. More specifically, disclosed embodiments relate to methods of manufacturing semiconductor devices that may improve reliability and quality when exposing conductive vias.

BACKGROUND

To facilitate electrical connection of circuitry on active surfaces of semiconductor devices, conductive vias may be formed from an active surface extending into a substrate comprising a semiconductor material. Ends of the conductive vias may be exposed at an opposing backside surface of the substrate. Such vias are commonly referred to as "Through-Silicon Vias" or "Through-Substrate Vias" (TSVs). Each conductive via may be isolated (electrically and physically) from the substrate with a dielectric layer having a thickness of between about 50 nm and about 1,000 nm. Such a dielectric layer may also be referred to as a "spacer layer" or a "liner." After the spacer-layer-encapsulated pillars of the conductive vias have been revealed by selectively removing material from the backside surface of the substrate, the backside surface of the substrate may be protected by depositing a barrier layer (e.g., of silicon nitride or silicon carbide) to prevent from diffusion of other materials (e.g., copper) into the substrate, forming electrical shorts between the conductive vias and the substrate. In addition, an oxide passivation layer may be deposited over the barrier layer to provide additional protection to the backside surface of the substrate and the barrier layer itself, as well as to isolate the conductive vias from one another. Thus, the chances of the metal materials contaminating the substrate, shorts forming between the conductive vias, and shorts forming between the conductive vias and the substrate may be significantly reduced. FIGS. 1A through 1E depict a conventional process for exposing the conductive material of a TSV in preparation for electrical connection.

With reference to FIG. 1A, a semiconductor device 100 in an intermediate state of fabrication is shown. The semiconductor device 100 comprises a thinned substrate 102 of semiconductor material such as, for example, a semiconductor wafer after backside grinding. The thinned substrate 102 is attached to a carrier substrate 104 using a temporary adhesive 106 for structural support during processing and handling. The grinding process may be relatively rapid, though imprecise, which may leave significant thickness variation in the remaining material of the substrate 102. Consequently, the ends of some conductive vias 108 may be much farther from a backside surface 112 of the substrate 102 than ends of other conductive vias 108. A conductive via 108 encapsulated in a spacer oxide shell 109 extends from an active surface 110 of the substrate 102 toward an opposing backside surface 112 of the substrate 102. As shown in FIG. 1B, a portion of the semiconductor material of the substrate 102 may be removed from the backside surface 112 by, for example, a dry etch process to expose the conductive via 108 at the backside surface 112. The material removal process may be selective, such that the spacer oxide shell 109 remains intact, reducing the risk of metal contamination to the exposed substrate 102. Referring to FIG. 1C, a barrier material 114, which may comprise silicon nitride (e.g., $Si_3N_4$), may be deposited over the backside surface 112 and the exposed portion of the conductive via 108, including the associated spacer oxide shell 109, using a conformal deposition process, such as, for example, a chemical vapor deposition (CVD) or physical vapor deposition (PVD) process. "Conformal deposition processes," as used herein, include all deposition processes that are capable of depositing materials to all exposed surfaces of a structure, regardless of orientation, such that the topography of the resulting structure generally resembles the topography the surfaces exhibited prior to deposition. As shown in FIG. 1D, an isolation material 116, which may comprise silicon oxide (e.g., $SiO_2$ or SiO), may be deposited over the barrier material 114 on a side opposing the substrate 102 using, for example, a conformal deposition process.

Referring to FIG. 1E, a portion of the isolation material 116, the barrier material 114, the spacer oxide shell 109, and the conductive via 108 may be removed to render a bottom surface 118 of the semiconductor device 100 substantially planar and expose an end of the conductive via 108 for electrical connection. For example, an abrasive planarization process, such as chemical-mechanical planarization (CMP) process, may be employed. The CMP process may stop before all of the isolation material 116 has been removed. The resulting semiconductor device 100 may include the barrier material 114 extending laterally over the backside surface 112 of the substrate 102 and longitudinally around a periphery of the conductive via 108. The isolation material 116 may extend laterally over the barrier material 114 and terminate at a portion of the barrier material 114 that extends longitudinally to cover a lateral exterior surface of the spacer oxide shell 109 surrounding the conductive via 108.

Conductive vias 108 exposed using the process described in connection with FIGS. 1A through 1E require deposition of a relatively thick layer of isolation material 116 (see FIG. 1D) to ensure all the conductive vias 108 are covered because the protruding height of individual vias 108 may vary significantly across an entire wafer. In addition, there is no clear indicator for when removal of the isolation material 116 and the barrier material 114 (see FIG. 1E) should stop. Insufficient removal means that some conductive vias 108 may not be exposed properly. Too much removal, especially by a mechanical process, such as CMP, may cause the conductive vias 102 to bend or otherwise deform, or even collapse due to applied shear force, compromising the connectivity of the semiconductor device 100, or may expose the substrate 102 to contamination by consuming all of the barrier material 114.

DETAILED DESCRIPTION

The illustrations presented herein are not meant to be actual views of any particular act in a method of fabricating a semiconductor device, intermediate product of such a method, semiconductor device itself, or component thereof, but are merely idealized representations employed to describe illustrative embodiments. Thus, the drawings are not necessarily to scale. Additionally, elements common between figures may retain the same or similar numerical designation.

Disclosed embodiments relate generally to methods of manufacturing semiconductor devices that may improve reliability and quality when exposing conductive vias. More specifically, disclosed are embodiments of methods of exposing conductive vias at a baskside surface of a semiconductor device that may ensure all conductive vias of a semiconductor device are exposed for connection, reduce (e.g., prevent) the occurrence of damage to the conductive vias and the substrate, increase control over the process by which the conductive vias are exposed, and decrease the likelihood that the substrate may be exposed to contamination.

Figure 2:
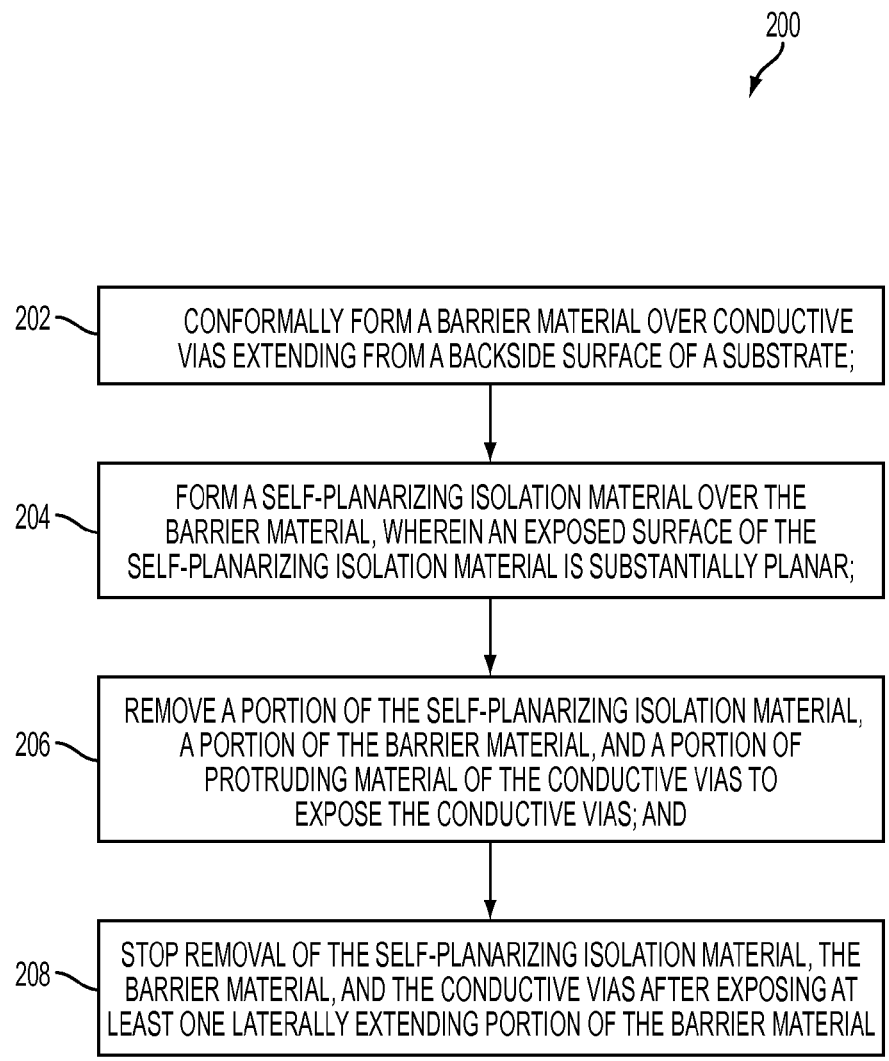
FIG. 2 is a flowchart of acts in a process according to embodiments of the disclosure for exposing conductive vias of a semiconductor device.

Referring to FIG. 2, a flowchart of acts in embodiments of a method 200 for exposing conductive vias of a semiconductor device is shown. A barrier material comprising a nitride may be formed (e.g., deposited) over revealed portions of conductive vias, which may be covered by a spacer material (e.g., an oxide), extending from a backside surface of a substrate, as indicated at 202. The barrier material may be formed using a conformal deposition process, such as, for example, a CVD or PVD process, such that the barrier material conforms to a topography of a substrate surface, including protruding conductive vias and any associated spacer material. In other words, the topography of the exposed surfaces on a surface (e.g., a backside surface) of the substrate opposing the active surface after deposition of the barrier material may resemble the topography of the exposed surfaces prior to such deposition, although some variation in topography is to be expected due to the added barrier material. The barrier material may comprise, for example, silicon nitride (e.g., $Si_3N_4$) or silicon carbide (e.g., SiC). A thickness of the barrier material may be less than a protruding height of the shortest conductive via, as measured from the backside surface of the substrate from which the vias protrude.

A self-planarizing isolation material may be formed over the barrier material, as indicated at 204. The topography of the exposed surfaces on the backside of the substrate after formation of the self-planarizing isolation material may differ significantly from the topography of the exposed surfaces prior to such formation. For example, the topography after formation of the self-planarizing isolation material may be substantially planar (e.g., may exhibit some curvature and surface irregularities due to surface tension and wetting to the conductive vias 212), whereas the topography before deposition may exhibit peaks and valleys defined by the substrate, the protruding conductive vias, and the conformal barrier material. As another example, the topography after deposition of the self-planarizing isolation material may be substantially planar with intermittent interruption by small portions of longer conductive vias and their associated overlaid barrier material. The self-planarizing isolation material may be non-conformal. In other words, an exposed surface of the self-planarizing isolation material may render itself at least substantially planar, such as, for example, as a precursor material of the self-planarizing isolation material flows under the influence of gravity and, in the case of a so-called "spin-on" dielectric material, centrifugal force applied by rotation of the substrate as a flowable precursor dielectric material is dispensed onto the substrate surface. The precursor material of the self-planarizing isolation material may be cured (e.g., hardened) to complete the self-planarizing isolation material, which may provide structural support to and isolate the conductive vias and their associated barrier material and spacer material. Curing conditions may be selected depending on the material selected for use as the self-planarizing isolation material and, therefore, are not described in detail herein.

A portion of the self-planarizing isolation material, a portion of the barrier material, and a portion of protruding material of the conductive vias, including any associated spacer material, may be removed to expose the conductive vias, as indicated at 206. Material removal may be accomplished by, for example, a selective etch process, chemical-mechanical polishing (CMP), or a combination of selective etching and CMP (e.g., sequentially or contemporaneously).

Material removal may be stopped after exposing a laterally extending portion of the barrier material, as indicated at 208. Exposure of the laterally extending portion of the barrier material may generate a detectable difference (e.g., an indication or a signal) in process response resulting from a transition in material removed during processing (e.g., from isolation material to barrier material), detection of such a difference or differences enabling the material removal process to be stopped after all the conductive vias have been exposed but before damaging the conductive vias, the substrate, or both. For example, exposure of the laterally extending portion of the barrier material may change (e.g., increase or decrease) the torque required to continue removing material using CMP because the barrier material may be more or less abrasion resistant than the self-planarizing isolation material (e.g., may change the coefficient of friction of at the contact interface between material removal machinery and the material removed). As another example, exposure of the laterally extending portion of the barrier material may enable detection of an increase in removal of byproducts, such as of ammonia ($NH_3$) in the waste liquid of a CMP process due to the hydrolysis of nitride material in aqueous solution, which may be detected by a liquid or gas sensor. As yet another example, exposure of the laterally extending portion of the barrier material may change (e.g., increase or decrease) the reflectivity of the exposed surface, which may be detected by an optical sensor. Accordingly, forming the barrier material to a thickness less than a protruding height of the shortest conductive via and stopping material removal after exposing a laterally extending portion of the barrier material may render the conductive via exposure process more controllable. In methods encompassed by the disclosure, no conductive vias may remain buried below the barrier material and a clear signal is detected to indicate when to stop removing excess material from the substrate surface. Additional details regarding methods for exposing conductive vias and resulting semiconductor devices are disclosed in conjunction with the following drawing figures.

Figure 3A:
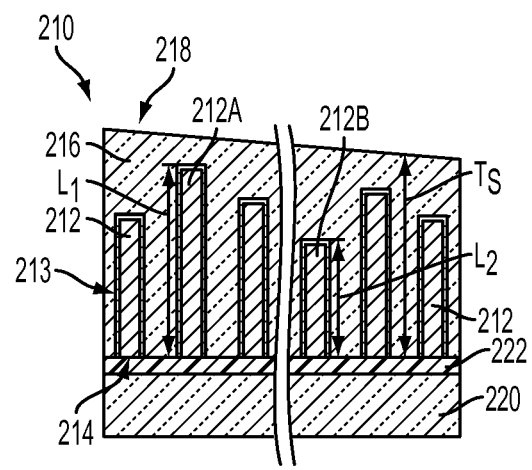
FIGS. 3A through 3G are cross-sectional views of a semiconductor device undergoing a process for exposing conductive vias of the semiconductor device according to an embodiment of the disclosure.

With reference to FIGS. 3A through 3G, cross-sectional views of a semiconductor device 210 undergoing a process for exposing conductive vias 212 of the semiconductor device 210 are shown. Referring specifically to FIG. 3A, the semiconductor device 210 is shown immediately after a backside surface 218 of a substrate 216 has been thinned (e.g., by grinding, etching, or both). Semiconductor material of the substrate 216 covers the conductive vias 212, which are formed to provide connectivity from integrated circuitry (not shown) on active surface 214 to opposing backside surface 218 of substrate 216. The semiconductor device 210 may comprise, for example, memory (e.g., NAND or NOR memory), logic, a processor, an imager, a device encompassing some combination of these (e.g., as a system on a chip), or any other type of semiconductor device. The conductive vias 212 may be formed by conventional techniques, which are not described in detail herein. The conductive vias 212 as formed may extend initially from an active surface 214 of a substrate 216 comprising semiconductor material toward an opposing backside surface 218 of the substrate 216. The conductive vias 212 may comprise an electrically conductive material, such as, for example, copper or aluminum. The conductive vias 212 may be encapsulated in a spacer material 213 (e.g., an oxide shell), to isolate metal material of the conductive vias 212 from semiconductor material of the substrate 216. The substrate 216 may be attached to a carrier substrate 220 for additional structural support during processing and handling using, for example, a temporary adhesive 222 over the active surface 214.

Because of processing variations inherent to formation of the conductive vias 212, the conductive vias 212 may not be of uniform length within a given substrate 216, across a wafer (not shown) including many substrates 216, or both. For example, a length $L_1$ of a longest conductive via 212A may be up to about 1 µm or more greater than a length $L_2$ of a shortest conductive via 212B. In addition, processing variations inherent to material removal from the backside surface 218 of the substrate 216 (e.g., by grinding) to thin substrate 216 from an initial thickness of, for example, about 600 µm to about 700 µm to a final thickness of 150 µm or less may result in the substrate 216 having a non-uniform thickness $T_S$. For example, a total thickness variation (TTV) for the substrate 216 may be between about 6.0 µm and about 7.0 µm (e.g., about 6.5 µm), with a thinner portion of substrate 216 located in a central region and a thicker portion of substrate 216 located around an edge thereof.

Figure 3B:
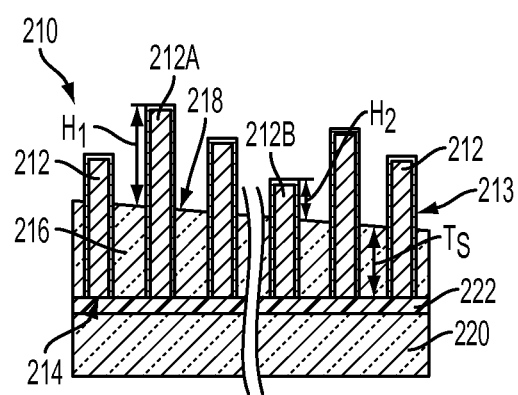

As shown in FIG. 3B, a portion of the substrate 216 at the backside surface 218 may be removed to expose portions of the conductive vias 212. For example, the substrate 216 may be subjected to an etching process to remove the semiconductor material of the substrate 216 selective to spacer material 213 of the conductive vias 212 so the conductive vias 212, and associated spacer material 213, may remain intact. For example, the lengths (e.g., $L_1$ and $L_2$ (see FIG. 3A)) of the conductive vias 212 may not be affected significantly by the material removal process used to remove the portion of the substrate 216 to expose the portions of the conductive vias 212, and any associated spacer material 213. The TTV for the substrate 216 after removing material from the backside surface 218 of the substrate 216 may decrease, but may still be significant. For example, the TTV for the substrate 216 after removing material from the backside surface 218 may be between about 5.0 µm and about 6.0 µm (e.g., about 5.5 µm). Although the TTV for the substrate 216 as a whole may decrease, relative differences between the level at which the backside surface 218 is located and terminal ends of the conductive vias 212 may shift upon exposure to the etching process. Consequently, taller conductive vias 212 previously located adjacent high (e.g., thick) portions of the substrate 216 may now be located adjacent low (e.g., thin) portions of the substrate 216, short conductive vias 212 previously located adjacent low portions of the substrate 216 may now be located adjacent relatively high portions of the substrate 216. Other variation in height difference between the backside surface 218 of the substrate 216 and the protruding portions of the conductive vias 212 before and after etching may also result.

After removal of the semiconductor material from the backside surface 218 of the substrate 216, all the conductive vias 212, including any associated spacer material 213, may protrude from the backside surface 218 of the substrate 216. As a result of variances in formation length of the conductive vias 212 and thickness $T_S$ of the substrate 216, heights to which the conductive vias 212 protrude from the backside surface 218 of the substrate 216 may vary significantly. For example, a difference in height between a tallest protruding portion of a conductive via 212A and a shortest protruding portion of a conductive via 212B may be between about 3.5 µm and about 5.5 µm. More specifically, the difference in height between the tallest protruding portion of a conductive via 212A and the shortest protruding portion of a conductive via 212B may be between about 4.5 µm and about 5.0 µm. As a specific, non-limiting example, a protruding height $H_1$ of a tallest protruding portion of a conductive via 212A may be about 8.1 µm and a protruding height $H_2$ of a shortest protruding portion of a conductive via 212B may be about 3.2 µm, resulting in a maximum difference in protruding height between tallest conductive via 212A and shortest conductive via 212B of about 4.9 µm.

Figure 3C:
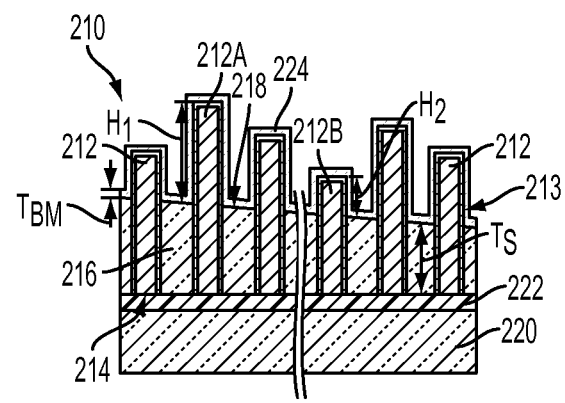

As shown in FIG. 3C, a barrier material 224 may be formed (e.g., deposited) over the conductive vias 212 and the backside surface 218 of the substrate 216 using a conformal deposition process after the substrate 216 has been thinned. For example, the barrier material 224 may be deposited using a low-temperature CVD or PVD process. More specifically, the barrier material 224 may be deposited using plasma-enhanced chemical vapor deposition (PECVD) at between room temperature (e.g., about 25° C.) and about 250° C. As specific, non-limiting examples, PECVD may be performed at between about 150° C. and about 200° C. using $SiH_4$, $NH_3$, and $N_2$ gases to form tetraethyl orthosilicate (TEOS) and deposit the barrier material 224, using $SiH_4$ and $N_2O$ gases to deposit the barrier material 224, or using TEOS and $O_2$ gases to deposit the barrier material 224 over the conductive vias 212, including any associated spacer material 213, and backside surface 218. As another example, the barrier material 224 may be formed from semiconductor material of a portion of the substrate 216 at the backside surface 218 using a diffusion process. As yet another example, the barrier material 224 may be formed from hydrogenated nanocrystalline silicon carbide using low-temperature (e.g., as low as about 150° C.) helicon wave plasma-enhanced CVD. The resulting barrier material 224 may comprise, for example, a nitride, an oxide, a carbide, or any combination of these. More specifically, the barrier material 224 may comprise, for example, silicon nitride (e.g., $Si_3N_4$), silicon oxide (e.g., $SiO_2$), silicon carbide (e.g., SiC), or some combination of these materials (e.g., $Si_3N_4$ and $SiO_2$ or an SiON material). Because the barrier material 224 conforms to the conductive vias 212 and the backside surface 218, the topography of an exposed surface of barrier material 224 after its deposition may generally resemble the topography of the conductive vias 212, including any associated spacer material 213, and the backside surface 218 prior to depositing the barrier material 224.

A thickness $T_{BM}$ of the barrier material 224 may be less than the protruding height $H_2$ of the shortest protruding portion of a conductive via 212B. More specifically, the thickness $T_{BM}$ of the barrier material 224 may be less than a difference between the protruding height $H_2$ of the shortest protruding portion of a conductive via 212B and an elevation of a thickest portion of the substrate 216. For example, the thickness $T_{BM}$ of the barrier material 224 may be less than about 1.5 µm. The thickness $T_{BM}$ of the barrier material 224 may be sufficiently great that the risk of damaging the conductive vias 212, and the substrate 216, through bending or toppling may be significantly reduced (e.g., prevented). For example, the thickness $T_{BM}$ of the barrier material 224 may be greater than about 800 Å. As a specific, non-limiting example, the thickness $T_{BM}$ of the barrier material 224 may be between about 800 Å and about 2,500 Å.

Figure 3D:
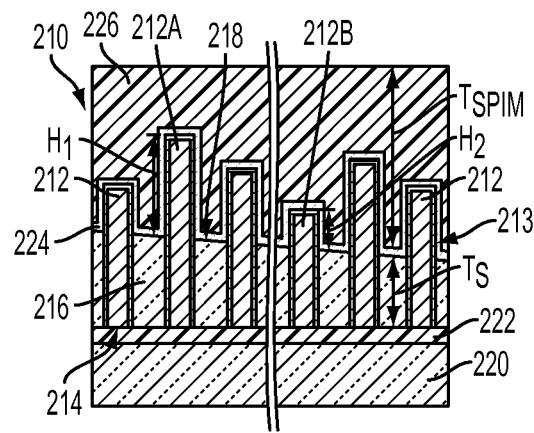

Referring to FIG. 3D, a self-planarizing isolation material 226 may be formed over the barrier material 224. The self-planarizing isolation material 226 may not conform to the topography of the barrier material 224, rendering the resulting topography of an exposed surface of isolation material 226 significantly different from the topography of the barrier material 224 prior to deposition of the self-planarizing isolation material 226. For example, the self-planarizing isolation material 226 may be flowable. More specifically, the self-planarizing isolation material 226 may exhibit, for example, a sufficiently low viscosity to flow around the protruding portions of the conductive vias 212 and over the backside surface 218 of the substrate 216 under the influence of gravity and in some cases, centrifugal force, rendering an exposed surface of the self-planarizing isolation material 226 planar. The self-planarizing isolation material 226 may be formed over the barrier material 224 using a deposition process conventionally used for flowable materials, such as, for example, spin-coating or nozzle dispensing, which may be followed by a curing process to harden the self-planarizing isolation material 226. The self-planarizing isolation material 226 may comprise, for example, any conventional resist material (e.g., poly(methyl methacrylate) (PMMA), poly(methyl glutarimide) (PMGI), phenol formaldehyde resin, etc.), a spin-on dielectric such as a polyimide, a polynorbornene, benzocyclobutene (BCB), polytetrafluoroethylene (PTFE), an inorganic polymer such as hydrogen silsesquioxane (HSQ) or methylsilsesquioxane (MSQ), or a spin-on glass (SOG) such as a siloxane-based organic SOG or a silicate-based inorganic SOG.

A thickness $T_{SPIM}$ of the self-planarizing isolation material 226 may be sufficiently great to structurally support the protruding portions of the conductive vias 212 during subsequent material removal processes. For example, the thickness $T_{SPIM}$ of the self-planarizing isolation material 226 may be greater than the protruding height $H_1$ of the tallest protruding portion of a conductive via 212A. More specifically, the thickness $T_{SPIM}$ of the self-planarizing isolation material 226 may be, for example, greater than about 2 µm, greater than about 5 µm, or even greater than about 10 µm. The self-planarizing isolation material 226 may be selected to exhibit a removal rate that is significantly faster than a removal rate of the barrier material 224. For example, the self-planarizing isolation material 226 may be chemically more reactive or mechanically weaker (e.g., softer and less abrasion resistant) than the barrier material 224 in response to a CMP process. In addition, the self-planarizing isolation material 226 may be removable using a selective material removal process (e.g., selective dry etch, which may also be characterized as a reactive ion etch (RIE)), which may not remove significant quantities of the barrier material 224, in some embodiments.

Figure 1A:
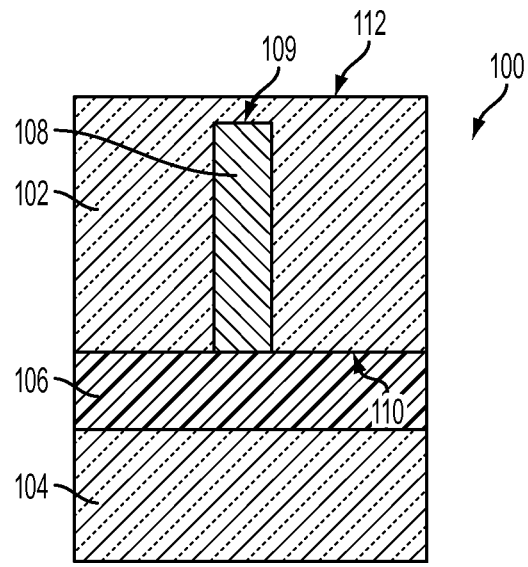
FIGS. 1A through 1E are cross-sectional views of a semiconductor device undergoing a conventional process for exposing a conductive via of the semiconductor device.
Figure 1B:
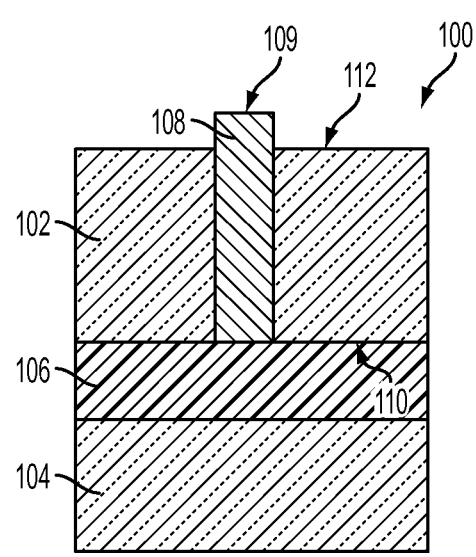
Figure 1C:
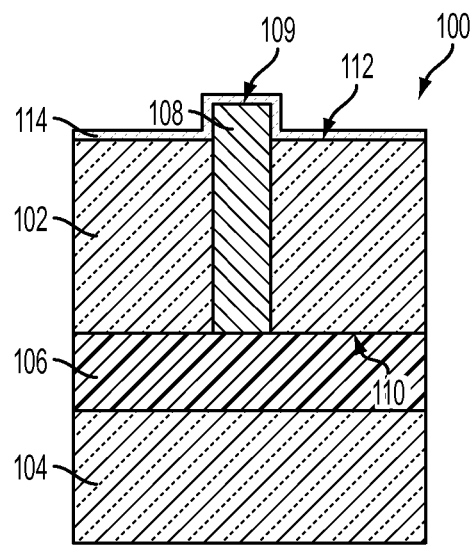
Figure 1D:
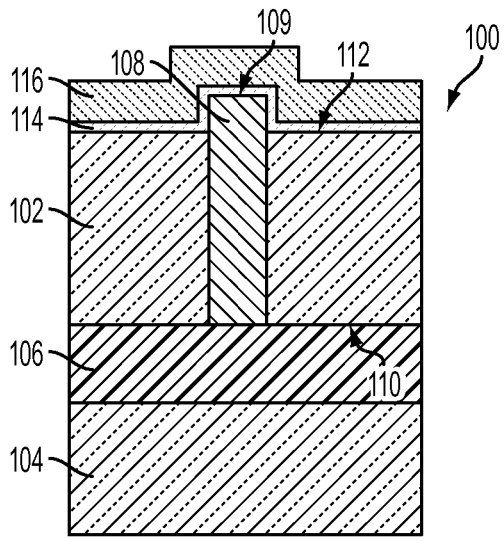
Figure 1E:
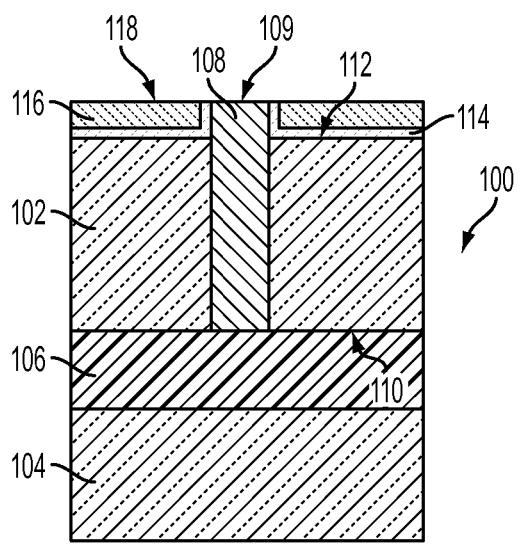
Figure 3E:
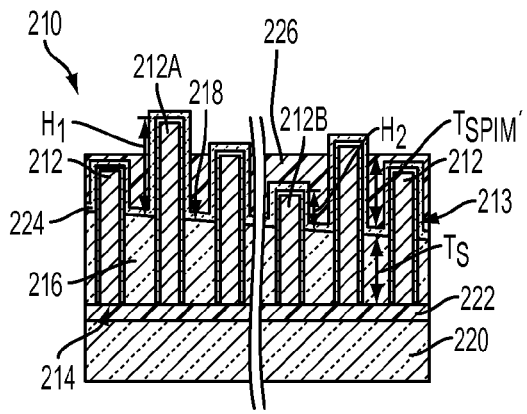

In some embodiments, a portion of the self-planarizing isolation material 226 may be removed, as shown in FIG. 3E, to reduce the thickness $T_{SPIM}'$ of the self-planarizing isolation material 226. The partial removal may be done using relatively fast material removal methods (e.g., non-selective dry etch or aggressive CMP) to reduce processing time. More specifically, a portion of the self-planarizing isolation material 226 may be removed at a rate faster than a rate of removal for a conformal isolation material 116 (see FIG. 1E) comprising silicon oxide using CMP. For example, a selective material removal process (e.g., a selective dry etch) may be used to remove the portion of the self-planarizing isolation material 226, leaving the barrier material 224 and the conductive vias 212, including any associated spacer material 213 intact. After selectively removing the portion of the self-planarizing isolation material 226, portions of the conductive vias 212, particularly the tallest conductive vias 212, and associated barrier material 224 may protrude from the self-planarizing isolation material 226. As another example, a non-selective material removal process (e.g., CMP) may be used to remove some of the self-planarizing isolation material 226, portions of the conductive vias 212, particularly the tallest conductive vias 212, and associated portions of the barrier material 224. Partial removal may leave sufficient quantities of the self-planarizing isolation material 226 between the conductive vias 212 to provide additional structural support during subsequent material removal processes, reducing (e.g., preventing) the occurrence of toppling.

Figure 3F:
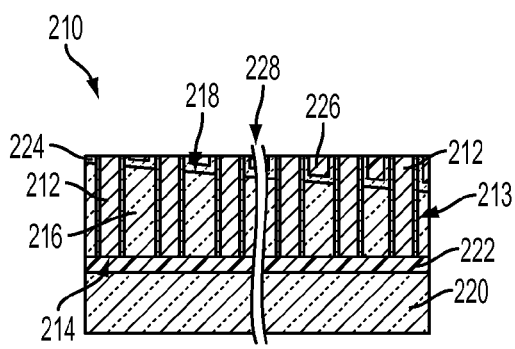
Figure 3G:
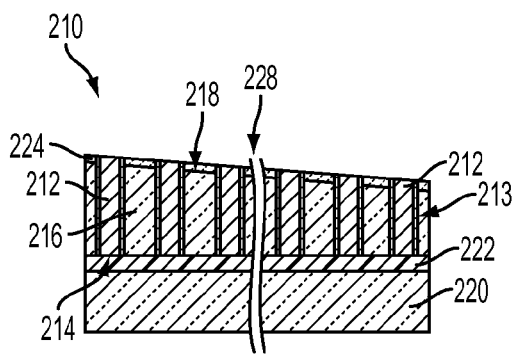

As shown in FIG. 3F, a portion of the self-planarizing isolation material 226, a portion of the barrier material 224, and a portion of the protruding sections of the conductive vias 212, including a portion of any associated spacer material 213, may be removed to expose the conductive vias 212 for electrical connection. The removal process may comprise, for example, CMP. Removal of the materials may take place at a slower rate than a material removal performed earlier in the process of exposing the conductive vias 212 (see FIG. 3E), enabling greater control for stopping the removal process after all conductive vias have been exposed, but before damaging the conductive vias 212, including any associated spacer material 213, and the substrate 216.

The removal process may be stopped when one or more laterally extending portions of the barrier material 224 are exposed. When referring to "laterally extending portions" of the barrier material 224, what is meant are the portions of the barrier material 224 extending substantially horizontally over (e.g., directly abutting) the backside surface 218 of the substrate 216 between the conductive vias 212, as opposed to the substantially vertically extending portions conforming to peripheries of the conductive vias 212 and the substantially horizontally extending portions formed over the conductive vias 212. In other words, at least one portion of the self-planarizing isolation material 226 located between conductive vias 212 may be completely removed, which portion may be located, for example, over a thickest portion of the substrate 216. Because the thickness $T_{BM}$ (see FIG. 3C) of the barrier material 224 is less than a difference between the elevation of the thickest portion of the substrate 216 and the protruding height $H_2$ (see FIG. 3E) of the shortest conductive via 212B, stopping removal after encountering a laterally extending portion of the barrier material 224 may ensure that all conductive vias 212 are exposed for electrical connection.

The exposure of the barrier material 224 may provide a detectable difference (e.g., a signal or an indication) for when to stop the material removal process. For example, the barrier material 224 may be significantly different from the self-planarizing isolation material 226 in one or more material properties, such as, for example, coefficient of friction. Accordingly, complete removal of one or more sections of the self-planarizing isolation material 226 between conductive vias 212 to expose the barrier material 224 may generate a difference in (e.g., more) friction between the barrier material 224 and a polishing pad on a rotating table of a CMP apparatus (not shown), causing a detectable difference in reactive torque experienced by the polishing table. When the reactive torque exceeds a predetermined threshold, the material removal process may be stopped. As another example, the barrier material 224 may contain a significantly higher concentration of nitrogen (e.g., in the form of nitrides) than is contained by the self-planarizing isolation material 226. Therefore, abrasive-containing liquid (e.g., slurry) conventionally used during CMP on the polishing pad may contact the partially or fully exposed barrier material 224 after one or more sections of the self-planarizing isolation material 226 have been removed. Nitrides (e.g., silicon nitride) may chemically react with liquid (e.g., acid) of the abrasive-containing liquid, generating a greater quantity of nitrogen-containing species distributed in the liquid phase and causing a detectable difference in the presence of such species (e.g., $NH_3H_2O$ or $NH_4^+$) in liquid waste. When the presence of nitrogen in the surrounding environment exceeds a preselected threshold, the material removal process may be stopped. As yet another example, the barrier material 224 may exhibit a different (e.g., greater or lesser) reflectivity than the self-planarizing isolation material 226. Accordingly, complete removal of one or more sections of the self-planarizing isolation material 226 may change the overall reflective properties of a bottom surface 228 (see FIGS. 3F and 3G) of the semiconductor device 210 responsive to exposure of portions of barrier material 224, exposure of ends of conductive vias 212, and any remaining exposed portions of self-planarizing isolation material 226. When the reflectivity of the bottom surface 228 exceeds or falls below a predetermined threshold, the material removal process may be stopped.

In some embodiments, the material removal process used to expose all the conductive vias 212 may be stopped when one or relatively few laterally extending portions of the barrier material 224 have been exposed, leaving substantial quantities of the self-planarizing isolation material 226 between the conductive vias 212. In such embodiments, the bottom surface 228 may be characterized by exposed connecting surfaces of conductive vias 212 conformally surrounded by barrier material 224, with self-planarizing isolation material 226 remaining between a majority (e.g., a vast majority) of the conductive vias 212 and their associated barrier material 224. One or some of the areas adjacent the conductive vias 212, however, will comprise or consist of exposed, laterally extending portions of the barrier material 224, as shown in FIG. 3F. In other embodiments, such as that shown in FIG. 3G, the material removal process used to expose all the conductive vias 212 may be stopped when a majority or all of the laterally extending portions of the barrier material 224 have been exposed, leaving insignificant quantities of the self-planarizing isolation material 226 between the conductive vias 212. In such embodiments, the bottom surface 228 may be characterized by exposed connecting surfaces of conductive vias 212 conformally surrounded by barrier material 224, with self-planarizing isolation material 226 being disposed between a minority (e.g., a small minority or none) of the conductive vias 212 and their associated barrier material 224, with none of the self-planarizing isolation material 226 remaining. Most or all of the areas between the conductive vias 212 will comprise or consist of exposed, laterally extending portions of the barrier material 224. In still other embodiments, the material removal process may be stopped at an intermediate stage, with some significant quantities of self-planarizing isolation material 226 remaining and other significant quantities of self-planarizing isolation material 226 being removed. In any event, the presence of a detectable change indicating when to stop the material removal process may ensure that all the conductive vias 212 are exposed for connection and significantly reduce the risk of damaging the conductive vias 212, the substrate 216, or both (e.g., by reducing the risk of forming a short between the conductive vias 212 and the substrate 216).

Accordingly, disclosed herein is a method of exposing conductive vias of a semiconductor device comprising conformally forming a barrier material over conductive vias extending from a backside surface of a substrate. A self-planarizing isolation material may be formed over the barrier material. An exposed surface of the self-planarizing isolation material may be substantially planar. A portion of the self-planarizing isolation material, a portion of the barrier material, and a portion of protruding material of the conductive vias may be removed to expose the conductive vias. Removal of the self-planarizing isolation material, the barrier material, and the conductive vias may be stopped after exposing at least one laterally extending portion of the barrier material.

In some embodiments, the method of exposing conductive vias of the semiconductor device may comprise removing a portion of a substrate at a backside surface opposing an active surface of the substrate to expose portions of conductive vias. A barrier material comprising silicon nitride, silicon oxide, silicon carbide, or any combination of these may be conformally formed over the conductive vias to a thickness less than a protruding height of a shortest conductive via. A self-planarizing isolation material may be formed over the barrier material. An exposed surface of the self-planarizing isolation material may be substantially planar. A portion of the self-planarizing isolation material, a portion of the barrier material, and a portion of protruding material of the conductive vias may be removed to expose the conductive vias. Removal of the self-planarizing isolation material, the barrier material, and the conductive vias may be stopped after exposing at least one laterally extending portion of the barrier material abutting the backside surface of the substrate.

Also disclosed herein is a semiconductor device comprising conductive vias in a substrate and comprising exposed surfaces at a backside surface of the substrate. A barrier material comprising silicon nitride, silicon oxide, silicon carbide, or any combination of these may surround the conductive vias. A self-planarizing isolation material may be located over at least a portion of the barrier material and between the conductive vias. At least one laterally extending portion of the barrier material may be exposed adjacent an associated conductive via.

Figure 4A:
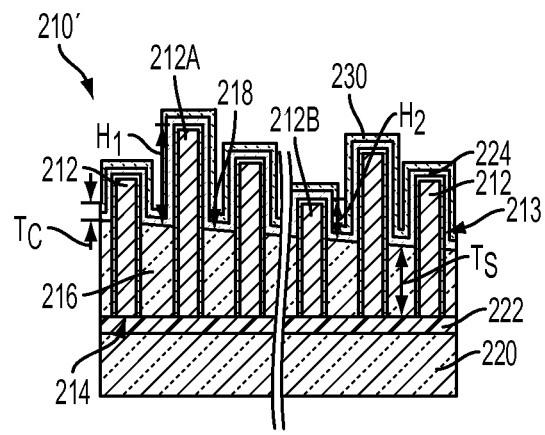
FIGS. 4A through 4D are cross-sectional views of a semiconductor device undergoing another process for exposing conductive vias of the semiconductor device according to another embodiment of the disclosure.

Referring to FIGS. 4A through 4D, cross-sectional views of a semiconductor device 210' undergoing another process for exposing conductive vias 212 of the semiconductor device 210' are shown. After the barrier material 224 has been conformally formed over the conductive vias 212 and the backside surface 218 of the substrate 216 (see FIG. 3C), a conformal isolation material 230 may be formed over the barrier material 224, as shown in FIG. 4A. The conformal isolation material 230 may substantially conform to the shape of the barrier material 224 so that the resulting topography after depositing the conformal isolation material 230 generally resembles the topography of the barrier material 224. The conformal isolation material 230 may comprise, for example, an oxide, a nitride, a carbide, or any combination of these. More specifically, the conformal isolation material 230 may comprise silicon oxide (e.g., $SiO_2$), silicon nitride (e.g., $Si_3N_4$), silicon carbide (e.g., SiC), or any combination of such materials. The conformal isolation material 230 may be deposited over the barrier material 224 using a low temperature (e.g., between about room temperature and 250° C.) conformal deposition process, such as, for example, CVD or PVD. More specifically, the barrier material 224 may be deposited using plasma-enhanced chemical vapor deposition (PECVD) at low temperatures. As specific, non-limiting examples, PECVD may be performed at between about 150° C. and about 200° C. using $SiH_4$, $NH_3$, and $N_2$ gases to form tetraethyl orthosilicate (TEOS) and deposit the barrier material 224, using $SiH_4$ and $N_2O$ gases to deposit the barrier material 224, or using TEOS and $O_2$ gases to deposit the conformal isolation material 230 over the barrier material 224.

A combined thickness $T_C$ of the barrier material 224 and the conformal isolation material 230 may be less than the protruding height $H_2$ of the shortest protruding portion of a conductive via 212B in some embodiments. More specifically, the combined thickness $T_C$ of the barrier material 224 and the conformal isolation material 230 may be less than a difference in elevation between a thickest portion of the substrate 216 and the protruding height $H_2$ of the shortest protruding portion of a conductive via 212B. For example, the combined thickness $T_C$ of the barrier material 224 and the conformal isolation material 230 may be between about 5,000 Å and about 15,000 Å. In some embodiments, the barrier material 224 may comprise between about 800 Å and about 2,500 Å of the combined thickness $T_C$, with the conformal isolation material 230 comprising a remainder of the combined thickness $T_C$. In other embodiments, the thickness $T_{BM}$ (see FIG. 3C) of the barrier material 224 may be less than the difference in elevation between the thickest portion of the substrate 216 and the protruding height $H_2$ of the shortest protruding portion of a conductive via 212B, while the combined thickness $T_C$ of the barrier material 224 and the conformal isolation material 230 may be greater than that difference in elevation.

Figure 4B:
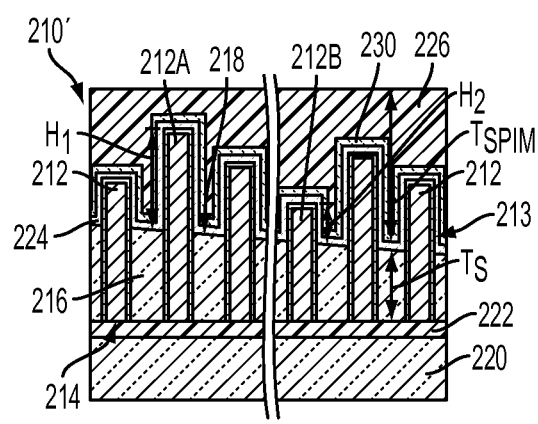

Referring to FIG. 4B, a self-planarizing isolation material 226 may be formed over the conformal isolation material 230. The self-planarizing isolation material 226 may not conform to the topography of the conformal isolation material 230, rendering the resulting topography significantly different from the topography of the conformal isolation material 230 prior to deposition of the self-planarizing isolation material 226. For example, the self-planarizing isolation material 226 may be a non-conformal, flowable material. More specifically, a precursor of the self-planarizing isolation material 226 may exhibit, for example, a sufficiently low viscosity to flow around the protruding portions of the conductive vias 212 and over the backside surface 218 of the substrate 216 under the influence of gravity and centrifugal force, in some cases (e.g., spin-on application). The self-planarizing isolation material 226 may be formed over the conformal isolation material 230 using a deposition process conventionally used for flowable materials, such as, for example, spin coating or nozzle dispensing, which may be followed by a curing process to harden the self-planarizing isolation material 226. The self-planarizing isolation material 226 may comprise, for example, any conventional resist material or spin-on dielectric.

A thickness $T_{SPIM}$ of the self-planarizing isolation material 226 may be sufficiently great to structurally support the protruding portions of the conductive vias 212 during subsequent exposure processes. For example, the thickness $T_{SPIM}$ of the self-planarizing isolation material 226 may be greater than the protruding height $H_1$ of the tallest protruding portion of a conductive via 212A. More specifically, the thickness $T_{SPIM}$ of the self-planarizing isolation material 226 may be, for example, greater than about 2 μm, greater than about 5 μm, or even greater than about 10 μm. The self-planarizing isolation material 226 may be selected to exhibit a removal rate that is significantly faster than a removal rate of the barrier material 224 and the conformal isolation material 230. For example, the self-planarizing isolation material 226 may be significantly different from the barrier material 224 and the conformal isolation material 230 in terms of one or more material properties (e.g., abrasion-resistance or reflectivity) or chemical behaviors. In addition, the self-planarizing isolation material 226 may be removable using a selective material removal process (e.g., a selective dry etch), which may not remove significant portions of the barrier material 224 or the conformal isolation material 230, in some embodiments.

Figure 4C:
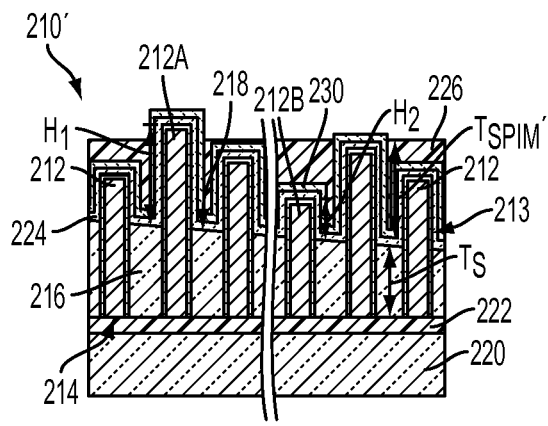

In some embodiments, a portion of the self-planarizing isolation material 226 may be removed, as shown in FIG. 4C, to reduce the thickness $T_{SPIM}'$ of the self-planarizing isolation material 226. The partial removal may be done using relatively fast material removal methods (e.g., selective dry etch or aggressive CMP) to reduce processing time. More specifically, a portion of the self-planarizing isolation material 226 may be removed at a rate faster than a rate of removal for a conformal isolation material 116 (see FIG. 1E) comprising silicon oxide using CMP. For example, a selective material removal process (e.g., a selective dry etch) may be used to remove some of the self-planarizing isolation material 226, leaving the conformal isolation material 230, the barrier material 224, and the conductive vias 212, including any associated spacer material 213, intact. After selectively removing a portion of the self-planarizing isolation material 226, portions of the conductive vias 212, particularly the tallest conductive vias 212, and associated conformal isolation material 230 and barrier material 224 may protrude from the self-planarizing isolation material 226. As another example, a non-selective material removal process (e.g., CMP) may be used to remove some of the self-planarizing isolation material 226, portions of the conductive vias 212, particularly the tallest conductive vias 212, and associated portions of the conformal isolation material 230 and the barrier material 224. Partial removal may leave sufficient quantities of the self-planarizing isolation material 226 between the conductive vias to provide additional structural support during subsequent material removal processes, reducing (e.g., preventing) the occurrence of toppling.

Figure 4D:
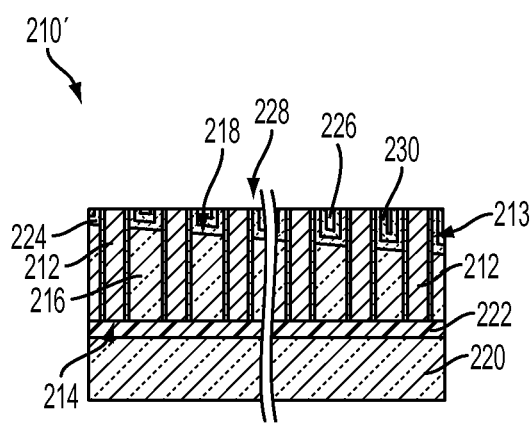

As shown in FIG. 4D, a portion of the self-planarizing isolation material 226, a portion of the conformal isolation material 230, a portion of the barrier material 224, and a portion of the protruding sections of the conductive vias 212, and any associated spacer material 213, may be removed to expose the conductive vias 212 for electrical connection. The removal process may comprise, for example, CMP. Removal of the materials may take place at a slower rate than a material removal performed earlier in the process of exposing the conductive vias 212 (see FIG. 4C), enabling greater control for stopping after all conductive vias 212 have been exposed, but before damaging the conductive vias 212, substrate 216, or both.

The removal process may be stopped when one or more laterally extending portions of the barrier material 224 are exposed in some embodiments. In such embodiments, at least one portion of the conformal isolation material 230 located between conductive vias 212 may be completely removed, which portion may be located, for example, over a thickest portion of the substrate 216. Because the thickness $T_{BM}$ (see FIG. 3C) of the barrier material 224 is less than a difference between the elevation of the thickest portion of the substrate 216 and the protruding height $H_2$ (see FIG. 4C) of the shortest conductive via 212B, stopping removal after encountering a laterally extending portion of the barrier material 224 may ensure that all conductive vias 212 are exposed for electrical connection. In other embodiments, the removal process may be stopped when one or more laterally extending portions of the conformal isolation material 230 are exposed. In such embodiments, at least one remaining portion of the self-planarizing isolation material 226 located between conductive vias 212 may be completely removed, which portion may be located, for example, over a thickest portion of the substrate 216. Because the combined thickness $T_C$ (see FIG. 4A) of the barrier material 224 and the conformal isolation material 230 may be less than a difference between the elevation of the thickest portion of the substrate 216 and the protruding height $H_2$ (see FIG. 4C) of the shortest conductive via 212B, stopping removal after encountering a laterally extending portion of the conformal isolation material 230 may guarantee that all conductive vias 212 are exposed for electrical connection.

Exposure of the conformal isolation material 230 or the barrier material 224 may provide a detectable difference (e.g., a signal or an indication) for when to stop the material removal process. For example, exposure of the conformal isolation material 230, the barrier material 224, or both may exhibit any of the properties described previously with regard to the barrier material 224 alone in connection with FIG. 3F that are significantly different from the properties of immediately overlying materials (e.g., the conformal isolation material 230 or the self-planarizing isolation material 226). When measurements of those properties fall below or exceed a preselected threshold, the material removal process may stop.

As described previously in connection with FIG. 3G, the material removal process may be optimized to remove more or less of the materials overlying the material used to provide a stopping signal, whether the specific signaling material be the barrier material 224 or the conformal isolation material 230.

Accordingly, disclosed herein is a method of exposing conductive vias of a semiconductor device comprising conformally forming a barrier material over conductive vias extending from a backside surface of a substrate. A conformal isolation material may be formed over the barrier material. A self-planarizing isolation material may be formed over the conformal isolation material. An exposed surface of the self-planarizing isolation material may be substantially planar. A portion of the self-planarizing isolation material, a portion of the conformal isolation material, a portion of the barrier material, and a portion of protruding material of the conductive vias may be removed to expose the conductive vias. Removal of the self-planarizing isolation material, the barrier material, and the conductive vias may be stopped after exposing a laterally extending portion of the conformal isolation material.

Figure 5A:
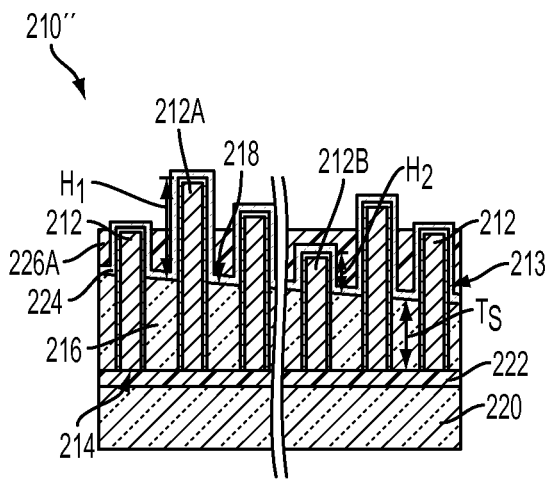
FIGS. 5A through 5D are cross-sectional views of a semiconductor device undergoing yet another process for exposing conductive vias of the semiconductor device according to another embodiment of the disclosure.

With reference to FIGS. 5A through 5D, cross-sectional views of a semiconductor device 210″ in yet another process for exposing conductive vias 212 of the semiconductor device 210″ are shown. After the barrier material 224 has been conformally formed over the conductive vias 212 and the backside surface 218 of the substrate 216 (see FIG. 3C), a first self-planarizing isolation material 226A may be formed over the barrier material 224, as shown in FIG. 5A. The first self-planarizing isolation material 226A may be formed, for example, at a thickness greater than the height $H_2$ of the shortest conductive via 212B but less than the height $H_1$ of the tallest conductive via 212A. The first self-planarizing isolation material 226A may not conform to the topography of the barrier material 224, rendering the resulting topography significantly different from the topography of the barrier material 224 prior to deposition of the first self-planarizing isolation material 226A. For example, the first self-planarizing isolation material 226A may be flowable to self-planarize. More specifically, a precursor material of the first self-planarizing isolation material 226A may exhibit, for example, a sufficiently low viscosity to flow around the protruding portions of the conductive vias 212, including any associated spacer material 213, and over the backside surface 218 of the substrate 216 under the influence of gravity and in some cases, centrifugal force, upon deposition. The first self-planarizing isolation material 226A may be formed over the barrier material 224 using a deposition process conventionally used for flowable materials, such as, for example, spin coating or nozzle dispensing. After depositing, the precursor material of the first self-planarizing isolation material 226A may be cured to harden the first self-planarizing isolation material 226A. For example, the first self-planarizing isolation material 226A may comprise a self-planarizing precursor material, such as poly(methyl methacrylate), poly(2,2,2 trifluoro-ethyl methacrylate), poly(dimethyl-siloxane), or AL-X2000 (a commercially available fluoropolymer), which may be spin-coated over the barrier material 224. The self-planarizing precursor material of the first self-planarizing isolation material 226A may then be cured using $H_2O_2$ at about 80° C. to about 120° C. to form silicon oxide (e.g., $SiO_2$). In some embodiments, ultraviolet radiation may be applied to speed up the curing process.

Figure 5B:
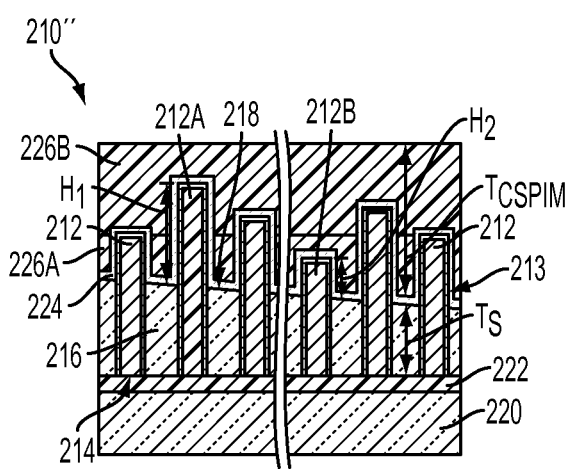

Referring to FIG. 5B, a second self-planarizing isolation material 226B may be formed over the first self-planarizing isolation material 226A. The second self-planarizing isolation material 226B may not conform to the topography of the first self-planarizing isolation material 226A and any protruding conductive vias 212, which may render the resulting topography significantly different from the topography of the first self-planarizing isolation material 226A and any protruding conductive vias 212 prior to deposition of the second self-planarizing isolation material 226B. For example, the second self-planarizing isolation material 226B may be a non-conformal, flowable material. More specifically, the second self-planarizing isolation material 226B may exhibit, for example, a sufficiently low viscosity to flow around the protruding portions of the conductive vias 212 and over the first self-planarizing isolation material 226A under the influence of gravity and in some cases, centrifugal force. The second self-planarizing isolation material 226B may be formed over the first self-planarizing isolation material 226A using a deposition process conventionally used for flowable materials, such as, for example, spin-coating or nozzle dispensing, which may be followed by a curing process to harden the second self-planarizing isolation material 226B. The second self-planarizing isolation material 226B may comprise, for example, any known resist material or spin-on dielectric. The material of the second self-planarizing isolation material 226B may be different from the material of the first self-planarizing isolation material 226A.

A combined thickness $T_{CSPIM}$ of the first and second self-planarizing isolation materials 226A and 226B may be sufficiently great to structurally support the protruding portions of the conductive vias 212, including any associated spacer material 213, during subsequent exposure processes. For example, the combined thickness $T_{CSPIM}$ of the first and second self-planarizing isolation materials 226A and 226B may be greater than the protruding height $H_1$ of the tallest protruding portion of a conductive via 212A. More specifically, the combined thickness $T_{CSPIM}$ of the first and second self-planarizing isolation materials 226A and 226B may be, for example, greater than about 2 μm, greater than about 5 μm, or even greater than about 10 μm.

The respective materials for first self-planarizing isolation material 226A and second self-planarizing isolation material 226B may be selected such that a removal rate of the second self-planarizing isolation material 226B may be significantly different from (e.g., faster than) a removal rate of the first self-planarizing isolation material 226A due to differences in material properties (e.g., abrasion-resistance, hydrophobia, hydrophilia) or chemical response. For example, the second self-planarizing isolation material 226B may be softer and less abrasion resistant than the first self-planarizing isolation material 226A. In addition, the second self-planarizing isolation material 226B may be removable using a selective material removal process (e.g., a selective dry etch), which may not remove the first self-planarizing isolation material 226A, in some embodiments.

Figure 5C:
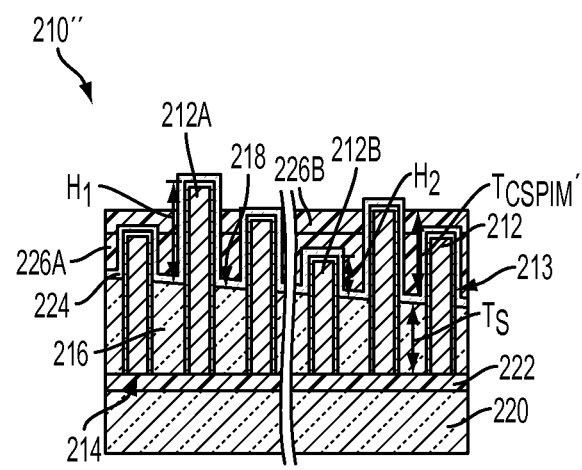

In some embodiments, some or all of the second self-planarizing isolation material 226B, and optionally a portion of the first self-planarizing isolation material 226A, may be removed, as shown in FIG. 5C, to reduce the combined thickness $T_{CSPIM}'$ of the first and second self-planarizing isolation materials 226A and 226B. The partial removal may be done using relatively fast material removal methods (e.g., selective dry etch or aggressive CMP) to reduce processing time. More specifically, a portion of the second self-planarizing isolation material 226B may be removed at a rate faster than a rate of removal for a conformal isolation material 116 (see FIG. 1E) comprising silicon oxide using CMP. For example, a selective material removal process (e.g., a selective dry etch) may be used to remove some of the second self-planarizing isolation material 226B, leaving the first self-planarizing isolation material 226A, the barrier material 224, and the conductive vias 212, including any associated spacer material 213, intact. After selectively removing a portion of the second self-planarizing isolation material 226B, portions of the conductive vias 212, particularly the tallest conductive vias 212, and associated barrier material 224 may protrude from the second self-planarizing isolation material 226B. As another example, a non-selective material removal process (e.g., CMP) may be used to remove some of the second self-planarizing isolation material 226B, portions of the conductive vias 212, particularly the tallest conductive vias 212, and associated portions of the barrier material 224. Partial removal may leave sufficient portions of the first and second self-planarizing isolation materials 226A and 226B, or just the first self-planarizing isolation material 226A, between the conductive vias 212 to provide structural support during subsequent material removal processes, reducing (e.g., preventing) the occurrence of toppling.

Figure 5D:
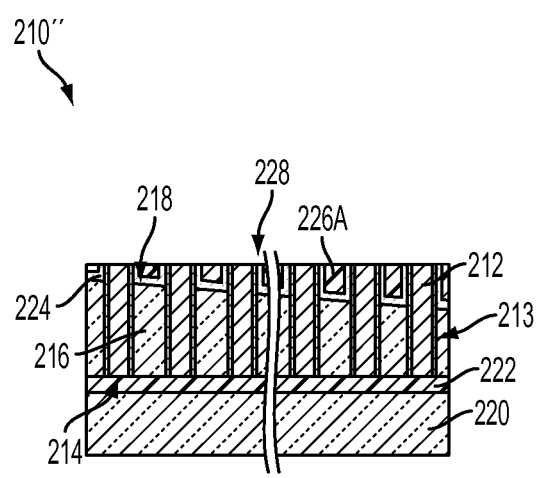

As shown in FIG. 5D, all of the second self-planarizing isolation material 226B (see FIG. 5C), a portion of the first self-planarizing isolation material 226A, a portion of the barrier material 224, and a portion of the protruding sections of the conductive vias 212, including any associated spacer material 213, may be removed to expose the conductive vias 212 for electrical connection. The removal process may comprise, for example, CMP. Removal of the materials may take place at a slower rate than a material removal performed earlier in the process of exposing the conductive vias 212 (see FIG. 5C), enabling greater control for stopping after all conductive vias have been exposed, but before damaging the conductive vias 212, substrate 216, or both.

The removal process may be stopped when one or more laterally extending portions of the barrier material 224 are exposed. In other words, at least one portion of the first self-planarizing isolation material 226A located between conductive vias 212 may be completely removed, which portion may be located, for example, over a thickest portion of the substrate 216. Because the thickness $T_{BM}$ (see FIG. 3C) of the barrier material 224 is less than a difference between the elevation of the thickest portion of the substrate 216 and the protruding height $H_2$ (see FIG. 3E) of the shortest conductive via 212B, stopping removal after encountering a laterally extending portion of the barrier material 224 may guarantee that all conductive vias 212 are exposed for electrical connection.

The barrier material 224 may provide a detectable difference (e.g., a signal or an indication) for when to stop the material removal process. For example, exposure of the barrier material 224 may exhibit any of the properties described previously in connection with FIG. 3F that are significantly different from the properties of immediately overlying materials (e.g., the first self-planarizing isolation material 226A). When measurements of those properties fall below or exceed a preselected threshold, the material removal process may cease.

As described previously in connection with FIG. 3G, the material removal process may be optimized to remove more or less of the materials overlying the barrier material 224 used to provide a stopping signal.

Figure 6:
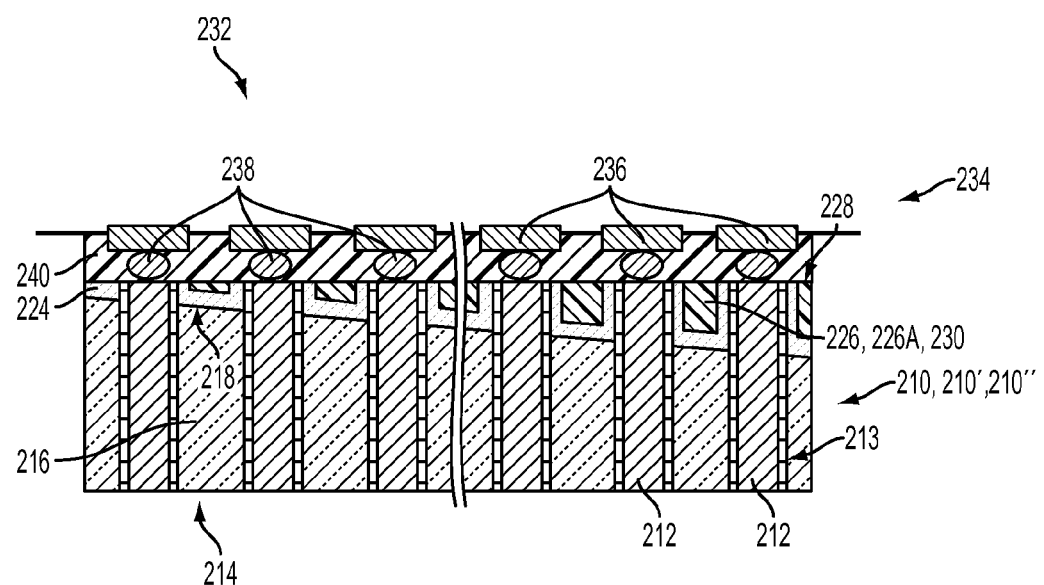
FIG. 6 is a block diagram of an electronic system comprising a semiconductor device, such as, for example, any of those shown in FIGS. 3F, 3G, 4D, and 5D.

Referring to FIG. 6, an electronic system 232 comprising a semiconductor device 210, 210', or 210", such as, for example, any of those shown in FIGS. 3F, 3G, 4D, and 5D, is shown. More specifically, the electronic system 232 may comprise a first semiconductor device 210, 210', or 210" operatively connected to a second semiconductor device 234. For example, the conductive vias 212 of the first semiconductor device 210, 210', or 210" may be electrically connected to bond pads 236 of the second semiconductor device 234 using conductive bumps 238. In some embodiments, an underfill material 240 may be flowed into a space defined between the first semiconductor device 210, 210', or 210" and the second semiconductor device 234 and around the conductive bumps 238. The second semiconductor device 234 may comprise any of those semiconductor devices described previously in connection with FIG. 3A. For example, the second semiconductor device 234 may be the same or substantially the same as the first semiconductor device 210, 210', or 210".

Accordingly, disclosed herein are electronic systems comprising a first semiconductor device. The first semiconductor device may comprise conductive vias in a substrate, the conductive vias comprising exposed surfaces at a backside surface of the substrate. A barrier material comprising silicon nitride, silicon oxide, silicon carbide, or any combination of these may surround the conductive vias. A self-planarizing isolation material may be located over at least a portion of the barrier material and between the conductive vias. At least one laterally extending portion of the barrier material may be exposed adjacent an associated conductive via. A second semiconductor device may be operatively connected to the first semiconductor device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being within the scope of the disclosure, as contemplated by the inventors.

What is claimed is:

1. A method of exposing conductive vias of a semiconductor device, comprising:
   conformally forming a barrier material comprising silicon nitride, silicon oxide, silicon carbide, or any combination of these over conductive vias extending from a backside surface of a substrate;
   forming a self-planarizing isolation material over the barrier material, wherein an exposed surface of the self-planarizing isolation material is substantially planar;
   removing a portion of the self-planarizing isolation material, a portion of the barrier material, and a portion of protruding material of the conductive vias to expose the conductive vias; and
   stopping removal of the self-planarizing isolation material, the barrier material, and the conductive vias after exposing at least one laterally extending portion of the barrier material.

2. The method of claim 1, wherein conformally forming the barrier material over the conductive vias comprises conformally forming the barrier material to a thickness less than a protruding height of a shortest protruding portion of a conductive via.

3. The method of claim 2, wherein conformally forming the barrier material to the thickness less than the protruding height of the shortest protruding portion of a conductive via comprises conformally forming the barrier material to a thickness of about 15,000 Å or less.

4. The method of claim 3, wherein conformally forming the barrier material to a thickness of 15,000 Å or less comprises conformally forming the barrier material to a thickness of between about 800 Å and about 2,500 Å.

5. The method of claim 1, wherein removing the portion of the self-planarizing isolation material, the portion of the barrier material, and a portion of protruding material of the conductive vias comprises selectively removing a first portion of the self-planarizing isolation material at a first rate and subsequently removing a second portion of the self-planarizing isolation material, the portion of the barrier material, and the portion of protruding material of the conductive vias at a second, slower rate.

6. The method of claim 1, further comprising stopping removal in response to detecting a change in rate of removal of at least one of the self-planarizing isolation material, the barrier material, and the conductive vias, a change in amount of ammonia gas present, or a change in light reflectivity of the semiconductor device.

7. The method of claim 1, wherein stopping removal of the self-planarizing isolation material, the barrier material, and the conductive vias after exposing the at least one laterally extending portion of the barrier material comprises stopping removal after exposing all of the barrier material extending laterally over the backside surface of the substrate.

8. The method of claim 1, further comprising removing a portion of the substrate at the backside surface to expose portions of the conductive vias before conformally forming the barrier material over the conductive vias.

9. The method of claim 1, wherein forming the self-planarizing isolation material over the barrier material comprises forming a first self-planarizing isolation material over the barrier material and a second, different self-planarizing isolation material over the first self-planarizing isolation material.

10. The method of claim 9, wherein forming the first self-planarizing isolation material over the barrier material and the second self-planarizing isolation material over the first self-planarizing isolation material comprises forming a first self-planarizing isolation material exhibiting a first removal rate over the barrier material and a second self-planarizing isolation material exhibiting a second, faster removal rate over the first self-planarizing isolation material.

11. The method of claim 1, further comprising forming a conformal isolation material comprising an oxide or a nitride over the barrier material before forming the self-planarizing isolation material.

12. A method of exposing conductive vias of a semiconductor device, comprising:
   removing a portion of a substrate at a backside surface opposing an active surface of the substrate to expose portions of conductive vias;
   conformally forming a barrier material comprising silicon nitride, silicon oxide, silicon carbide, or any combination of these over the conductive vias to a thickness less than a protruding height of a shortest conductive via;
   forming a self-planarizing isolation material over the barrier material, wherein an exposed surface of the self-planarizing isolation material is substantially planar;
   removing a portion of the self-planarizing isolation material, a portion of the barrier material, and a portion of protruding material of the conductive vias to expose the conductive vias; and
   stopping removal of the self-planarizing isolation material, the barrier material, and the conductive vias after exposing at least one laterally extending portion of the barrier material abutting the backside surface of the substrate.

13. The method of claim 12, wherein conformally forming the barrier material to the thickness less than the protruding height of the shortest conductive via comprises conformally forming the barrier material to a thickness of 2,500 Å or less.

14. The method of claim 12, further comprising removing a first portion of the self-planarizing isolation material at a first rate and wherein removing the portion of the self-planarizing isolation material, the portion of the barrier material and the portion of protruding material of the conductive vias comprises subsequently removing a second portion of the self-planarizing isolation material, the portion of the barrier material, and the portion of protruding material of the conductive vias at a second, slower rate.

15. The method of claim 12,
   wherein forming the self-planarizing isolation material over the barrier material comprises forming a first self-planarizing isolation material over the barrier material, and
   further comprising forming a second, different self-planarizing isolation material over the first self-planarizing isolation material,
   wherein removing the portion of the self-planarizing isolation material, the portion of the barrier material, and the portion of protruding material of the conductive vias comprises removing a portion of the second self-planarizing isolation material at a first rate and subsequently removing a remainder of the second self-planarizing isolation material, a portion of the first self-planarizing isolation material, the portion of the barrier material and the portion of protruding material of the conductive vias at a second, slower rate.

16. The method of claim 15, wherein forming the first self-planarizing isolation material comprises forming a self-planarizing precursor material and curing the self-planarizing precursor material to form a silicon oxide.

17. The method of claim 12, further comprising forming a conformal isolation material comprising a silicon oxide or silicon nitride over the barrier material before forming the self-planarizing isolation material, wherein a combined thickness of the conformal isolation material and the barrier material is less than the protruding height of the shortest protruding portion of the conductive via.

18. A method of exposing conductive vias of a semiconductor device, comprising:
conformally forming a barrier material comprising silicon nitride, silicon oxide, silicon carbide, or any combination of these over conductive vias extending from a backside surface of a substrate;
forming a conformal isolation material over the barrier material;
forming a self-planarizing isolation material over the conformal isolation material, wherein an exposed surface of the self-planarizing isolation material is substantially planar;
removing a portion of the self-planarizing isolation material, a portion of the conformal isolation material, a portion of the barrier material, and a portion of protruding material of the conductive vias to expose the conductive vias; and
stopping removal of the self-planarizing isolation material, the barrier material, and the conductive vias after exposing at least one laterally extending portion of the conformal isolation material.

19. The method of claim 18, wherein removing the portion of the self-planarizing isolation material, the portion of the conformal isolation material, the portion of the barrier material, and the portion of protruding material of the conductive vias comprises selectively etching a first portion of the self-planarizing isolation at a first rate and subsequently chemically mechanically polishing a second portion of the conformal isolation material, the portion of the barrier material, and the portion of protruding material of the conductive vias at a second, slower rate.

20. The method of claim 18, wherein a combined thickness of the barrier material and the conformal isolation material is less than a difference in elevation between the backside surface of the substrate at a thickest portion of the substrate and a protruding portion of a conductive via.

21. A semiconductor device, comprising:
conductive vias in a substrate and comprising exposed surfaces at a backside surface of the substrate;
a barrier material comprising silicon nitride, silicon oxide, silicon carbide, or any combination of these surrounding the conductive vias; and
a self-planarizing isolation material over at least a portion of the barrier material and located between the conductive vias,
wherein at least one laterally extending portion of the barrier material is exposed adjacent an associated conductive via.

22. The semiconductor device of claim 21, wherein exposed surfaces of the conductive vias, the barrier material, and the self-planarizing isolation material are at least substantially coplanar.

23. The semiconductor device of claim 21, wherein a thickness of the barrier material is less than a difference in elevation between the backside surface of the substrate at a thickest portion of the substrate and a protruding portion of a conductive via.

24. The semiconductor device of claim 21, further comprising a conformal isolation material comprising silicon oxide interposed between the barrier material and the self-planarizing isolation material.

25. The semiconductor device of claim 21, wherein the self-planarizing isolation material exhibits a first removal rate and the barrier material exhibits a second, slower removal rate.

26. An electronic system, comprising:
a first semiconductor device, comprising:
conductive vias in a substrate and comprising exposed surfaces at a backside surface of the substrate;
a barrier material comprising silicon nitride, silicon oxide, or both surrounding the conductive vias; and
a self-planarizing isolation material over at least a portion of the barrier material and located between the conductive vias,
wherein at least one laterally extending portion of the barrier material is exposed adjacent an associated conductive via; and
a second semiconductor device operatively connected to the first semiconductor device.

\* \* \* \* \*